United States Patent
Hou et al.

(10) Patent No.: US 9,824,902 B1
(45) Date of Patent: Nov. 21, 2017

(54) INTEGRATED FAN-OUT PACKAGE AND METHOD OF FABRICATING THE SAME

(71) Applicant: Taiwan Semiconductor Manufacturing Co., Ltd., Hsinchu (TW)

(72) Inventors: Hao-Cheng Hou, Hsinchu (TW); Chien-Hsun Lee, Hsin-chu County (TW); Chen-Hua Yu, Hsinchu (TW); Chung-Shi Liu, Hsinchu (TW); Jung-Wei Cheng, Hsinchu (TW); Ping-Kang Huang, Chiayi (TW); Sao-Ling Chiu, Hsinchu (TW); Tsung-Ding Wang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/207,512

(22) Filed: Jul. 12, 2016

(51) Int. Cl.
*H01L 21/56* (2006.01)
*H01L 25/065* (2006.01)
(Continued)

(52) U.S. Cl.
CPC ...... *H01L 21/568* (2013.01); *H01L 21/31053* (2013.01); *H01L 21/56* (2013.01); *H01L 21/561* (2013.01); *H01L 21/563* (2013.01); *H01L 21/565* (2013.01); *H01L 21/6835* (2013.01); *H01L 21/78* (2013.01); *H01L 23/28* (2013.01); *H01L 23/31* (2013.01);
(Continued)

(58) Field of Classification Search
CPC ..... H01L 21/56; H01L 21/561; H01L 21/563; H01L 21/565; H01L 21/568; H01L 21/58; H01L 23/28; H01L 23/31; H01L 23/3114; H01L 23/3121; H01L 23/3135; H01L 23/3157; H01L 23/3185; H01L 23/3192; H01L 23/48; H01L 23/485
See application file for complete search history.

(56) References Cited

U.S. PATENT DOCUMENTS

| | | | |
|---|---|---|---|
| 7,619,901 B2 * | 11/2009 | Eichelberger | H01L 21/6835 361/763 |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2011/0291288 A1 | 12/2011 | Wu et al. | |
| 2012/0161279 A1 * | 6/2012 | Lin | H01L 21/561 257/531 |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |

(Continued)

*Primary Examiner* — Eduardo A Rodela
(74) *Attorney, Agent, or Firm* — JCIPRNET

(57) ABSTRACT

An integrated fan-out package including a chip module, a second integrated circuit, a second insulating encapsulation, and a redistribution circuit structure is provided. The chip module includes a first insulating encapsulation and a first integrated circuit embedded in the first insulating encapsulation, and the first integrated circuit includes a first surface and first conductive terminals on the first surface. The second integrated circuit includes a second surface and second conductive terminals on the second surface. The chip module and the second integrated circuit are embedded in the second insulating encapsulation. The first and second conductive terminals are accessibly exposed from the first and second insulating encapsulation. The redistribution circuit structure covers the first surface, the second surfaces, the first insulating encapsulation, and the second insulating encapsulation. The redistribution circuit structure is electrically connected to the first and second conductive terminals. Methods of fabricating the integrated fan-out package are also provided.

11 Claims, 17 Drawing Sheets

(51) Int. Cl.
    *H01L 23/31*         (2006.01)
    *H01L 23/00*         (2006.01)
    *H01L 23/538*       (2006.01)
    *H01L 25/00*         (2006.01)
    *H01L 21/683*       (2006.01)
    *H01L 21/78*         (2006.01)
    *H01L 21/3105*      (2006.01)
    *H01L 23/28*         (2006.01)

(52) U.S. Cl.
    CPC ...... *H01L 23/3107* (2013.01); *H01L 23/3114* (2013.01); *H01L 23/3157* (2013.01); *H01L 23/3185* (2013.01); *H01L 23/5389* (2013.01); *H01L 24/14* (2013.01); *H01L 24/96* (2013.01); *H01L 25/0655* (2013.01); *H01L 25/50* (2013.01); *H01L 2221/68386* (2013.01); *H01L 2224/0231* (2013.01); *H01L 2224/02379* (2013.01); *H01L 2224/13024* (2013.01); *H01L 2224/13147* (2013.01); *H01L 2924/01029* (2013.01); *H01L 2924/14* (2013.01); *H01L 2924/19102* (2013.01)

(56) References Cited

U.S. PATENT DOCUMENTS

| | | | |
|---|---|---|---|
| 2015/0001703 A1* | 1/2015 | Choi | H01L 25/50 257/734 |
| 2015/0084206 A1* | 3/2015 | Lin | H01L 23/5389 257/774 |
| 2015/0091167 A1* | 4/2015 | Geissler | B81C 1/00261 257/738 |

* cited by examiner

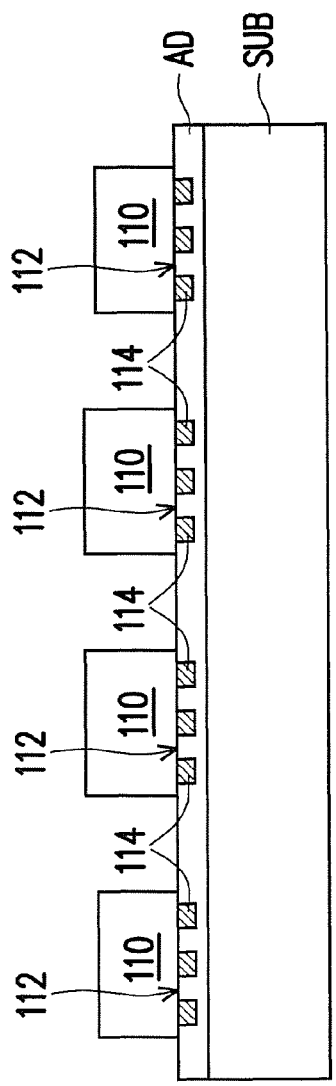
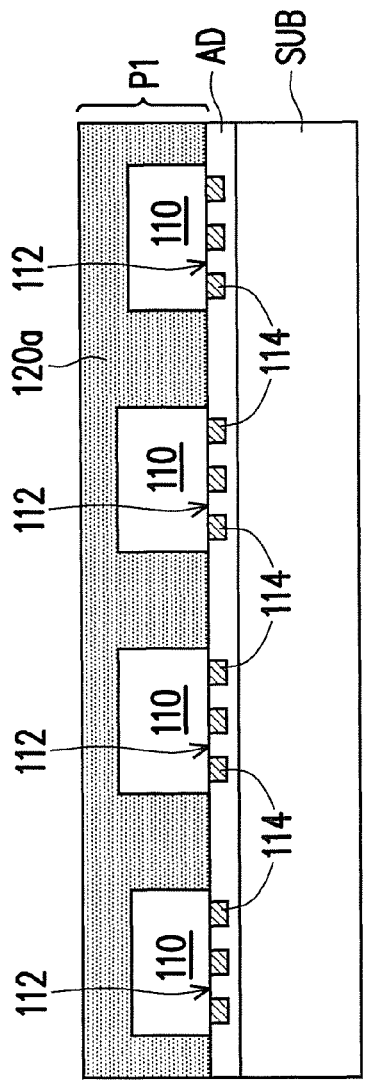

INTEGRATED FAN-OUT PACKAGE AND METHOD OF FABRICATING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages including multiple chips that are encapsulated by the molding compound, reliability of electrical connection between the chips and the redistribution circuit structure fabricated on the molding compound may deteriorate due to thickness difference between the chips. How to increase yield rate of the fabrication of integrated fan-out packages is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 1E illustrate a process flow for fabricating a chip module in accordance with some embodiments.

DETAILED DESCRIPTION

Figure 1C:
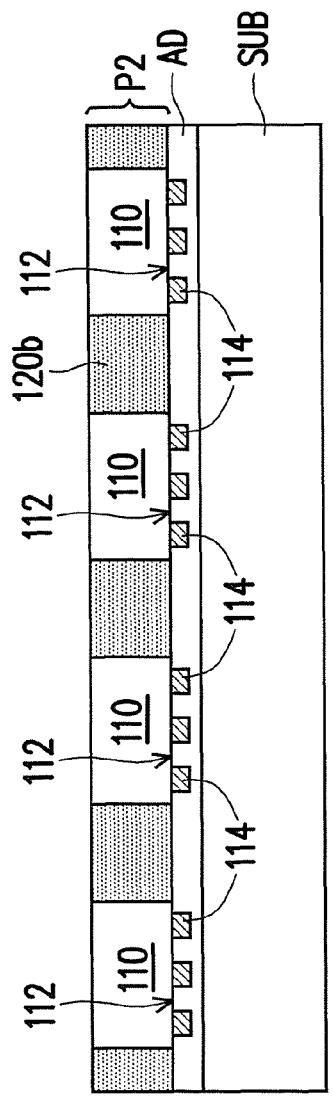

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A through 1E illustrate a process flow for fabricating a chip module in accordance with some embodiments. Referring to FIG. 1A, a plurality of first integrated circuits 110 are provided and mounted onto a substrate SUB through an adhesive AD between the first integrated circuits 110 and the substrate SUB. In some embodiments, the substrate SUB is a glass substrate, and the adhesive AD is a light-to-heat conversion (LTHC) release layer formed on the glass substrate. However, the materials of the adhesive AD and the substrate SUB are merely for illustration, and the disclosure is not limited thereto.

As shown in FIG. 1A, in some embodiments, each of the first integrated circuits 110 includes a first surface 112 and a plurality of first conductive terminals 114 distributed on the first surface 112. The first surfaces 112 are active surfaces of the first integrated circuits 110. The first integrated circuits 110 are flipped onto the adhesive AD such that the first surfaces 112 may face the substrate SUB. The first surfaces 112 of the first integrated circuits 110 are in contact with the adhesive AD, and the first conductive terminals 114 of the first integrated circuits 110 are embedded in the adhesive AD. In some embodiments, the first conductive terminals 114 may be conductive pillars, conductive bumps, or conductive vias. For example, the first conductive terminals 114 are plated copper pillars, plated copper bumps, or plated copper vias. After first integrated circuits 110 are flipped onto the adhesive AD, the first surfaces 112 of first integrated circuits 110 are coplanar with one another.

In some embodiments, the first integrated circuits 110 may be fabricated by different third parties and have various thicknesses. Even though the first integrated circuits 110 are fabricated by the same party, different batches of the first integrated circuits 110 may still have thickness variation. In order to minimize the thickness variation or difference of the first integrated circuits 110, a thickness leveling process as illustrated in FIGS. 1B through 1E is required to be performed.

Referring to FIG. 1B, an insulating material 120a is formed on the adhesive AD to encapsulate the first integrated circuits 110 to form a pre-molded structure P. The first integrated circuits 110 are sandwiched between the insulating material 120a and the adhesive AD. In some embodiments, the insulating material 120a is a molding compound formed by a molding process. The rear surfaces and sidewalls of the first integrated circuits 110 are encapsulated by the insulating material 120a. In other words, the first integrated circuits 110 are protected by the insulating material 120 and the adhesive AD. In some embodiments, the insulating material 120a includes epoxy or other suitable resins.

As shown in FIG. 1B, the pre-molded structure P1 includes the insulating material 120a (e.g., the afore-said molding compound) and the first integrated circuits 110 embedded in the insulating material 120a.

Referring to FIG. 1C, after the insulating material 120a (e.g., the afore-said molding compound) is formed, a grinding process is performed to reduce the thickness of the pre-molded structure P1. In some embodiments, as shown in FIG. 1C, the insulating material 120a and the first integrated circuits 110 are grinded until the rear surfaces of all the first integrated circuits 110 are exposed. After the grinding process is performed, the grinded first integrated circuits 110 are substantially identical in thickness, the insulating material 120a is grinded to form an insulating material 120b, and the grinded first integrated circuits 110 are encapsulated by the insulating material 120b.

In some embodiments, the insulating material 120a is grinded through mechanical grinding process and/or chemical mechanical polishing (CMP) process, for example.

After the grinding process is performed, a grinded pre-molded structure P2 is formed. The grinded pre-molded structure P2 includes the insulating material 120b (e.g., a grinded molding compound) and the first integrated circuits 110 embedded in the insulating material 120b. In some embodiments, as shown in FIG. 1C, the first integrated circuits 110 and the insulating material 120b are substantially identical in thickness. Due to the above-mentioned grinding process, the thickness variation or thickness difference of the first integrated circuits 110 in the pre-molded structure P2 are minimized.

Figure 5:
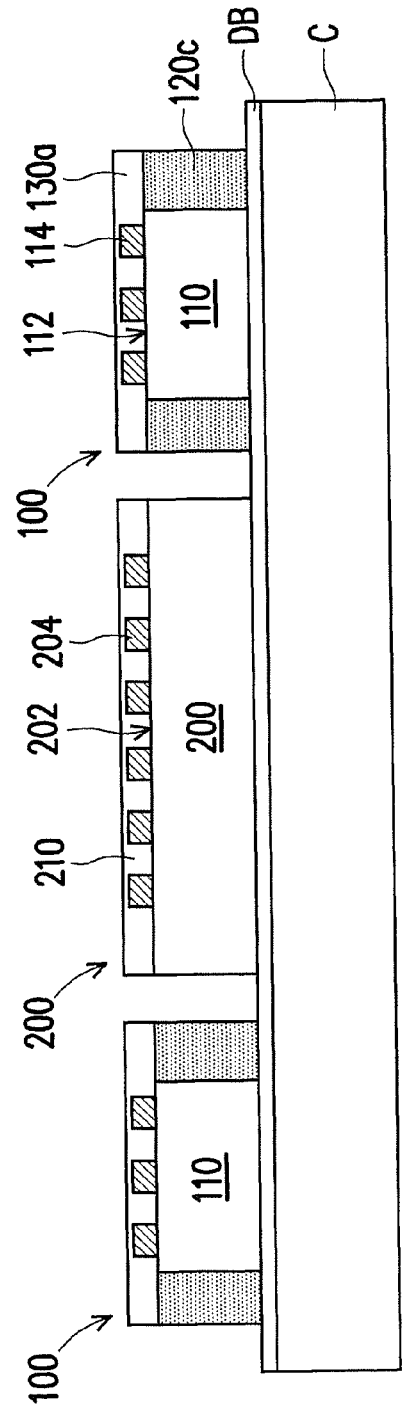

In some embodiments, the insulating material 120a (shown in FIG. 1B) is grinded such that the thickness of the grinded pre-molded structure P2 (shown in FIG. 1C) is substantially equal to the thickness of the second integrated circuit 200 (shown in FIG. 5).

Figure 1D:
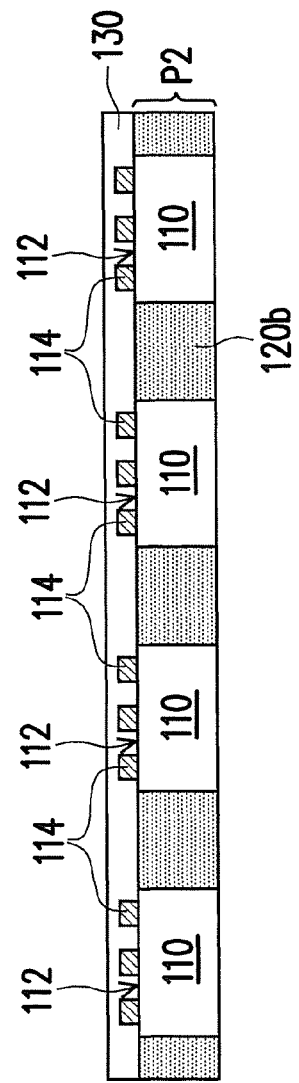

Referring to FIG. 1D, the pre-molded structure P2 is de-bonded from the adhesive AD carried by the substrate SUB. In some embodiments, the adhesive AD (e.g., the LTHC release layer) may be irradiated by an UV laser such that the pre-molded structure P2 is peeled from the adhesive AD and the substrate SUB.

After the pre-molded structure P2 is de-bonded from the adhesive AD, a dielectric material 130 is formed on the pre-molded structure P2 to cover the first surfaces 112 and the first conductive terminals 114 of first integrated circuits 110. As shown in FIG. 1D, the first surfaces 112 and the first conductive terminals 114 are protected by the dielectric material 130. In some embodiments, the dielectric material 130 is a polybenzoxazole (PBO) layer or other suitable polymer dielectrics, for example.

Figure 1E:
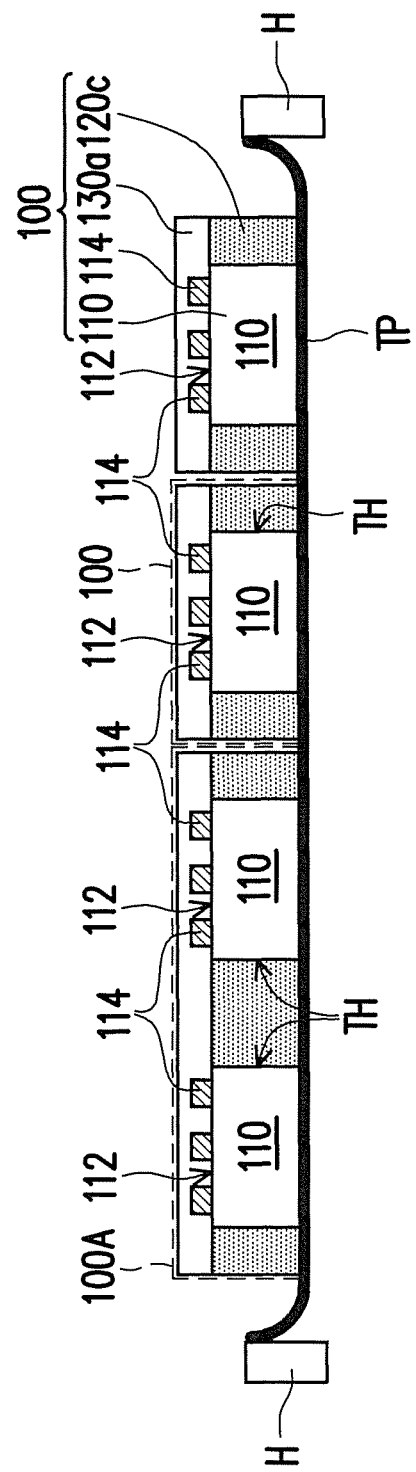

Referring to FIG. 1E, after the dielectric material 130 is formed on the pre-molded structure P2, the pre-molded structure P2 and the dielectric material 130 are placed on a tape TP supported by a holder H. In some embodiments, the tape TP may be a die-saw tape adhered with the pre-molded structure P2, the holder H may be a frame having an aperture, and the tape TP is fixed in the aperture of the holder H. The pre-molded structure P2 and the dielectric material 130 are then singulated to form a plurality of chip modules 100 and/or multi-chip modules 100A. After the singulation process is performed, the chip modules 100 and/or multi-chip modules 100A are still adhered with the tape TP.

The pre-molded structure P2 and the dielectric material 130 are singulated through a die saw process, for example. After the insulating material 120b of the pre-molded structure P2 is cut, a plurality of first insulating encapsulation 120c for encapsulating sidewalls of the first integrated circuits 110 are formed. After the dielectric material 130 is cut, a plurality of first dielectric layers 130a (e.g., a polybenzoxazole layer) are formed to cover the first surfaces 112 of the first integrated circuits 110, top surfaces of the first insulating encapsulation 120c, and the first conductive terminals 114. In some alternative embodiments, the dielectric material 130 and the dielectric layers 130a may be omitted in accordance with design requirements. In other words, the first surfaces 112 of the first integrated circuits 110 and the first conductive terminals 114 are accessibly exposed from the dielectric material 130.

As shown in FIG. 1E, different types of chip modules (e.g., the chip modules 100 and the multi-chip modules 100A) are fabricated. The thickness of chip modules 100 and the multi-chip modules 100A is substantially equal to the thickness of the second integrated circuit 200 (shown in FIG. 5). In the chip module 100, merely one integrated circuit 110 is embedded in the first insulating encapsulation 120c. In other words, the first insulating encapsulation 120c of the chip module 100 includes one first through hole TH for accommodating the first integrated circuit 110. In the multi-chip module 100A, two integrated circuits 110 are embedded in the first insulating encapsulation 120c. In other words, the first insulating encapsulation 120c of the multi-chip module 100A includes two first through holes TH for accommodating the first integrated circuits 110. The number of the first through holes TH is corresponding to the number of the first integrated circuits 110.

As shown in FIG. 1B through 1E, after the above-mentioned thickness leveling process is accomplished, the thickness variation or thickness difference of the chip modules 100 and/or the multi-chip module 100A can be minimized.

Figure 2A:
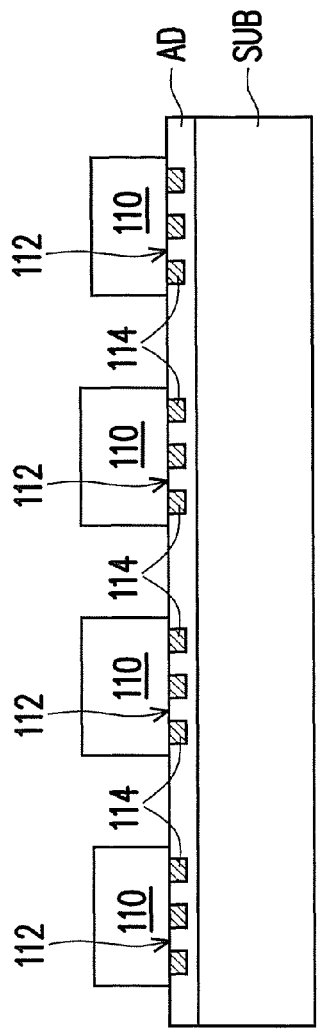
FIGS. 2A through 2E illustrate another process flow for fabricating a chip module in accordance with some embodiments.
Figure 2B:
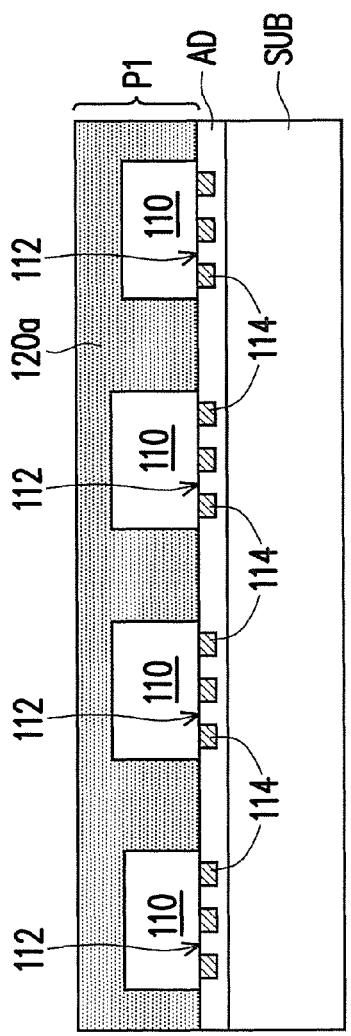
Figure 2C:
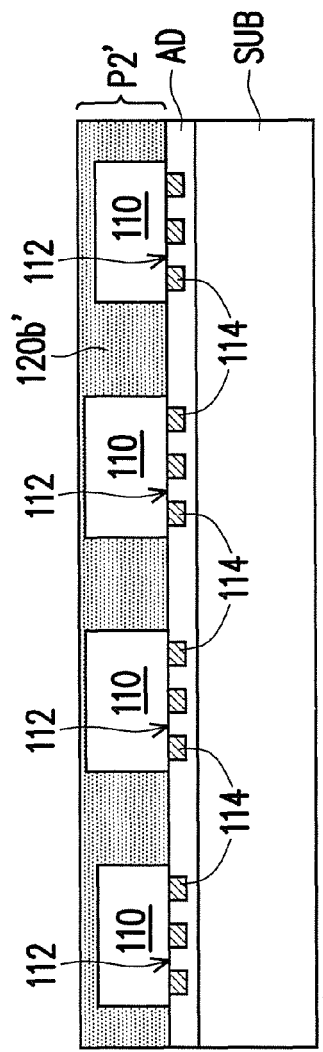

FIGS. 2A through 2E illustrate another process flow for fabricating a chip module in accordance with some embodiments. Referring to FIGS. 1A through 1E and FIGS. 2A through 2E, the fabricating process illustrated in FIGS. 2A through 2E is similar with the fabricating process described in FIGS. 1A through 1E except that the formation of the grinded pre-molded structure P2', as shown in FIG. 2C.

Figure 2D:
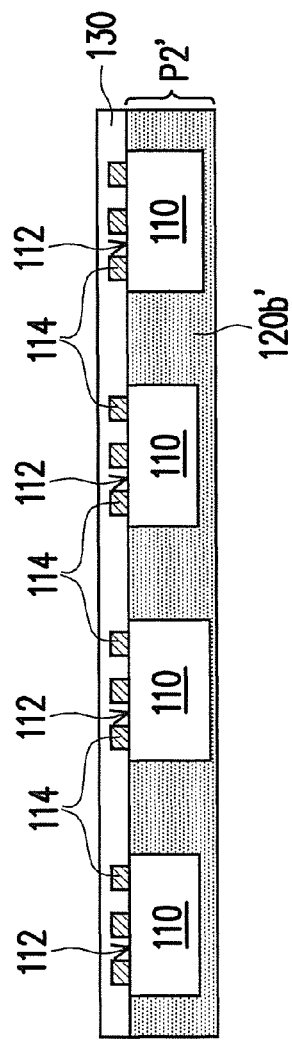

Referring to FIG. 2B and FIG. 2D, the pre-molded structure P1 is grinded to form a grinded pre-molded structure P2'. Specifically, the insulating material 120a is grinded to form an insulating material 120b' (shown in FIGS. 2C and 2D), and the rear surfaces of all the first integrated circuits 110 are not revealed after the insulating material 120a is grinded. In some embodiments, the insulating material 120a (shown in FIG. 2B) is grinded such that the thickness of the grinded pre-molded structure P2' (shown in FIG. 2C) is substantially equal to the thickness of the second integrated circuit 200 (shown in FIG. 5).

In some alternative embodiments, the grinding process of the pre-molded structure P1 may be omitted. In other words, the thickness of the insulating material 120a is substantially equal to the thickness of the second integrated circuit 200 (shown in FIG. 5), and no further grinding process is required to be performed to reduce the thickness of the insulating material 120a.

Figure 2E:
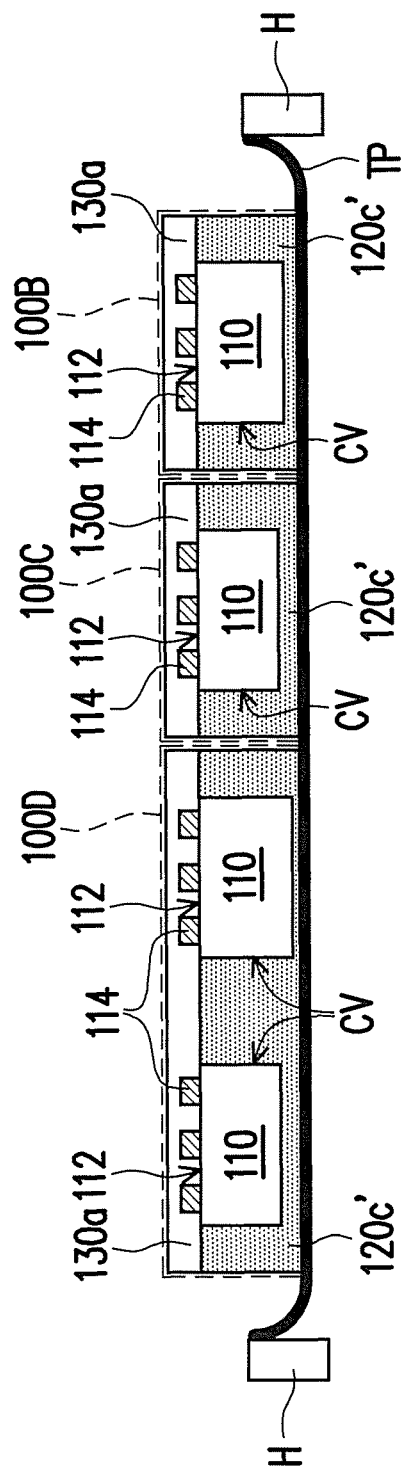

Referring to FIG. 2E, after the dielectric material 130 is formed on the pre-molded structure P2', the pre-molded structure P2' and the dielectric material 130 are placed on a tape TP supported by a holder H. In some embodiments, the tape TP may be a die-saw tape adhered with the pre-molded structure P2', the holder H may be a frame having an aperture, and the tape TP is fixed in the aperture of the holder H. The pre-molded structure P2' and the dielectric material 130 are then singulated to form a plurality of chip modules 100B, chip modules 100C and/or multi-chip modules 100D. After the singulation process is performed, the chip modules 100B, chip modules 100C and/or multi-chip modules 100D are still adhered with the tape TP.

The pre-molded structure P2' and the dielectric material 130 are singulated through a die saw process, for example. After the insulating material 120b' of the pre-molded structure P2' is cut, a plurality of first insulating encapsulation 120c' for encapsulating sidewalls of the first integrated circuits 110 are formed. After the dielectric material 130 is cut, a plurality of first dielectric layers 130a are formed to cover the first surfaces 112 of the first integrated circuits 110, top surfaces of the first insulating encapsulation 120c', and the first conductive terminals 114. In some alternative embodiments, the dielectric material 130 and the dielectric layers 130a may be omitted in accordance with design requirements. In other words, the first surfaces 112 of the first integrated circuits 110 and the first conductive terminals 114 are accessibly exposed from the dielectric material 130.

As shown in FIG. 2E, different types of chip modules (e.g., the chip modules 100B, the chip modules 100C and/or the multi-chip modules 100D) are fabricated. The thickness of the chip modules 100B, the chip modules 100C, and the multi-chip modules 100D is substantially equal to the thickness of the second integrated circuit 200 (shown in FIG. 5). In the chip module 100B and the chip module 100C, merely one integrated circuit 110 is embedded in the first insulating encapsulation 120c', and the first insulating encapsulation 120c' of the chip module 100B and the chip module 100C respectively includes one cavity CV for accommodating the first integrated circuit 110. The depth of the cavity CV is less than a thickness of the first insulating encapsulation 120c'. Furthermore, the cavity CV in the chip module 100B may be different from the cavity CV in the chip module 100C, while the thickness of the integrated circuit 110 in the chip module 100B may be different from the thickness of the integrated circuit 110 in the chip module 100C.

In the multi-chip module 100D, two integrated circuits 110 are embedded in the first insulating encapsulation 120c', and the first insulating encapsulation 120c' of the multi-chip module 100D includes two cavities CV for accommodating the first integrated circuits 110. In some embodiments, the cavities CV in the multi-chip module 100D may be different in depth, the depths of the cavities CV are less than a thickness of the first insulating encapsulation 120c', and the thickness of the integrated circuits 110 in the multi-chip module 100D may be different from each other. The number of the cavities CV is corresponding to the number of the first integrated circuits 110.

Figure 3A:
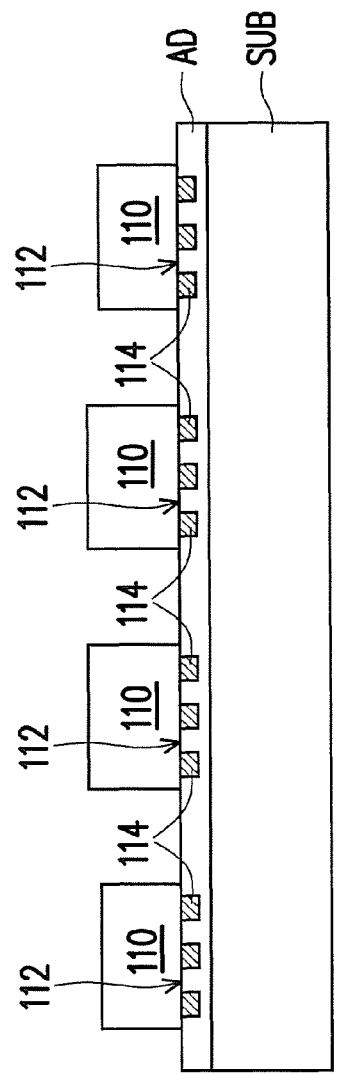
FIGS. 3A through 3E illustrate yet another process flow for fabricating a chip module in accordance with some embodiments.
Figure 3B:
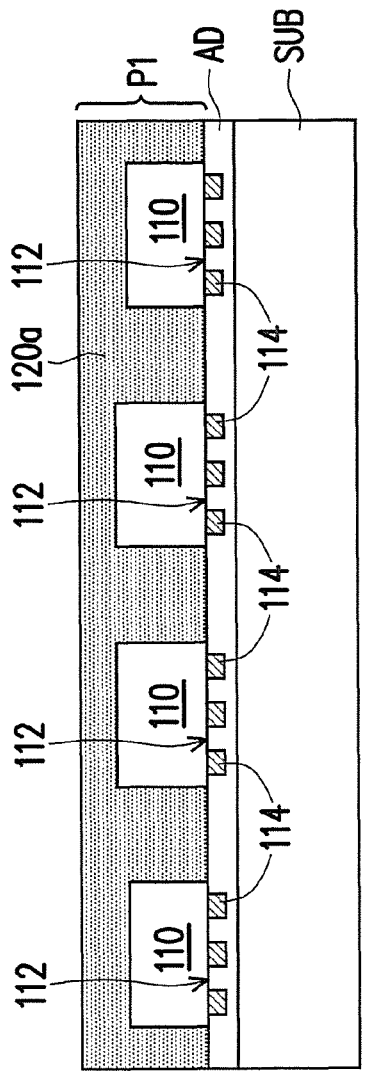
Figure 3C:
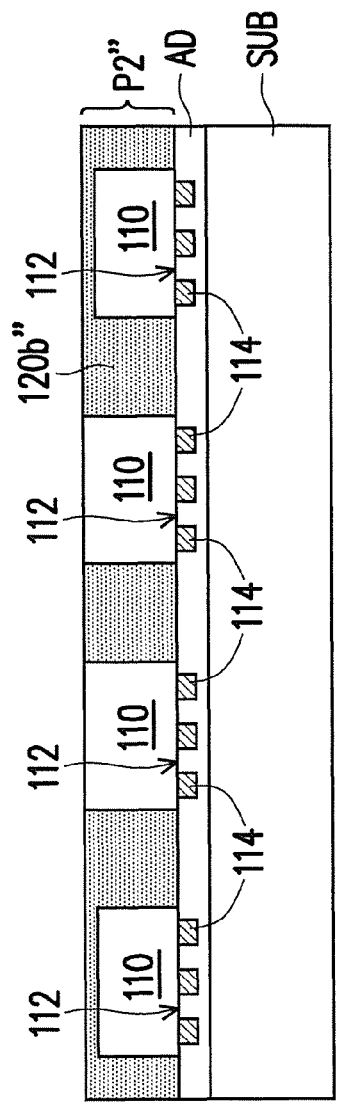

FIGS. 3A through 3E illustrate yet another process flow for fabricating a chip module in accordance with some embodiments. Referring to FIGS. 2A through 2E and FIGS. 3A through 3E, the fabricating process illustrated in FIGS. 3A through 3E is similar with the fabricating process described in FIGS. 2A through 2E except that the formation of the grinded pre-molded structure P2", as shown in FIG. 3C.

Figure 3D:
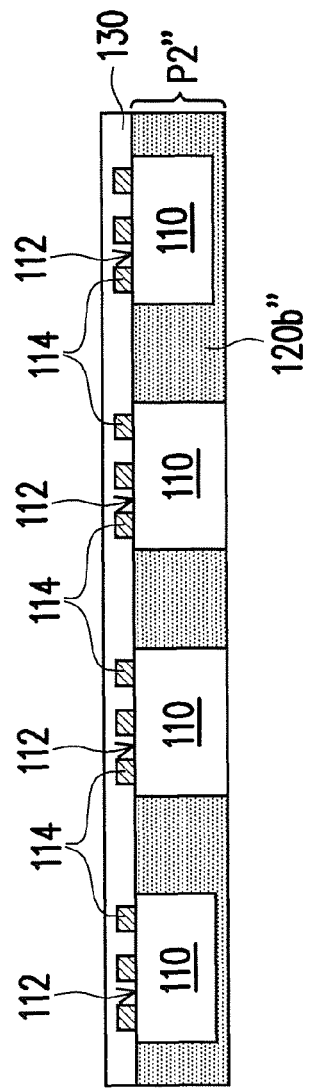

Referring to FIG. 3B and FIG. 3D, the pre-molded structure P1 is grinded to form a grinded pre-molded structure P2". Specifically, the insulating material 120a is grinded to form an insulating material 120b" (shown in FIGS. 3C and 3D), and the rear surfaces of parts of the first integrated circuits 110 are revealed after the insulating material 120a is grinded. In some embodiments, the insulating material 120a (shown in FIG. 3B) is grinded such that the thickness of the grinded pre-molded structure P2" (shown in FIG. 3C) is substantially equal to the thickness of the second integrated circuit 200 (shown in FIG. 5).

Figure 3E:
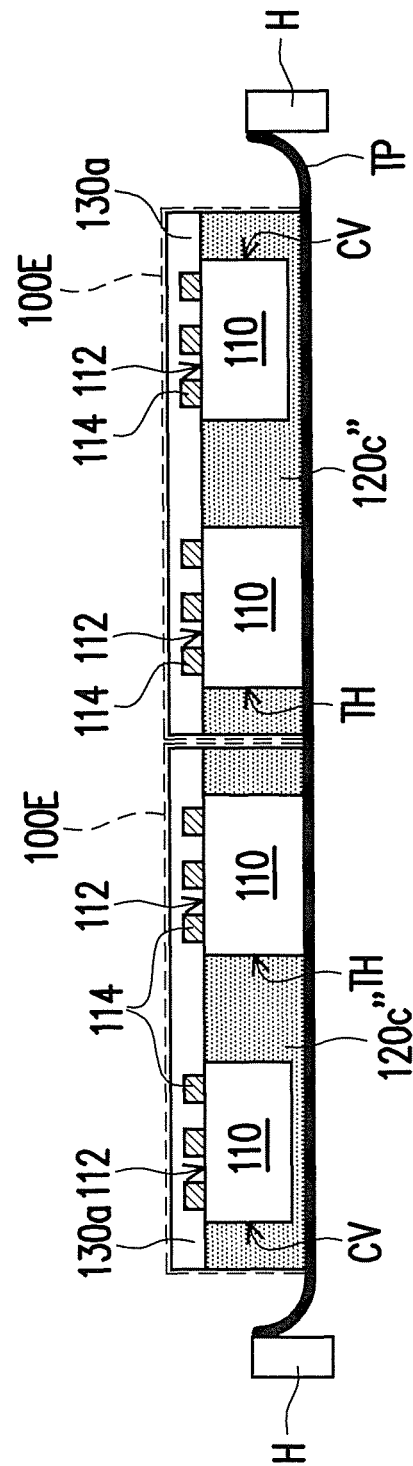

Referring to FIG. 3E, after the dielectric material 130 is formed on the pre-molded structure P2", the pre-molded structure P2" and the dielectric material 130 are placed on a tape TP supported by a holder H. In some embodiments, the tape TP may be a die-saw tape adhered with the pre-molded structure P2", the holder H may be a frame having an aperture, and the tape TP is fixed in the aperture of the holder H. The pre-molded structure P2" and the dielectric material 130 are then singulated to form a plurality of multi-chip modules 100E. After the singulation process is performed, the multi-chip modules 100E are still adhered with the tape TP.

The pre-molded structure P2" and the dielectric material 130 are singulated through a die saw process, for example. After the insulating material 120b" of the pre-molded structure P2" is cut, a plurality of first insulating encapsulation 120c" for encapsulating at least sidewalls of the first integrated circuits 110 are formed. After the dielectric material 130 is cut, a plurality of first dielectric layers 130a are formed to cover the first surfaces 112 of the first integrated circuits 110, top surfaces of the first insulating encapsulation 120c", and the first conductive terminals 114. In some alternative embodiments, the dielectric material 130 and the dielectric layers 130a may be omitted in accordance with design requirements. In other words, the first surfaces 112 of the first integrated circuits 110 and the first conductive terminals 114 are accessibly exposed from the dielectric material 130.

As shown in FIG. 3E, the thickness of the multi-chip modules 100E is substantially equal to the thickness of the second integrated circuit 200 (shown in FIG. 5). In the multi-chip module 100E, two integrated circuits 110 having various thicknesses are embedded in the first insulating encapsulation 120c", and the first insulating encapsulation 120c" includes one cavity CV and a first through hole TH for accommodating the first integrated circuits 110. The depth of the cavity CV is less than a thickness of the first insulating encapsulation 120c". The total number of the cavity CV and the first through hole TH is corresponding to the number of the first integrated circuits 110.

FIGS. 4 through 10 are cross-sectional views illustrating a process flow for fabricating an integrated fan-out package in accordance with some embodiments.

Figure 4:
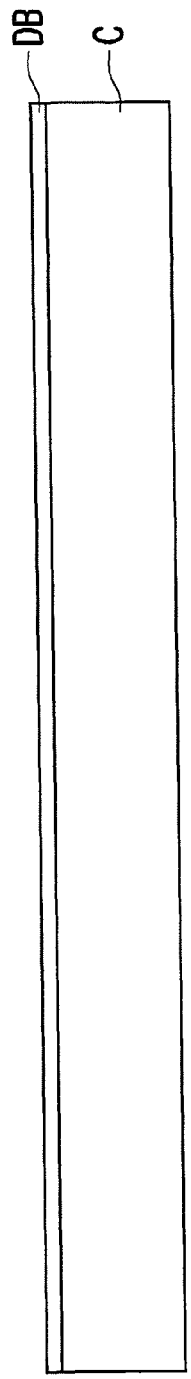
FIGS. 4 through 10 are cross-sectional views illustrating a process flow for fabricating an integrated fan-out package in accordance with some embodiments.

Referring to FIG. 4, a carrier C having a de-bonding layer DB formed thereon is provided. The de-bonding layer DB is formed on an upper surface of the carrier C, for example. In some embodiments, the carrier C is a glass substrate, and the de-bonding layer DB is a light-to-heat conversion (LTHC) release layer formed on the glass substrate. However, the materials of the de-bonding layer DB and the carrier C are merely for illustration, and the disclosure is not limited thereto.

Referring to FIG. 5, at least one chip module 100 and a second integrated circuit 200 are placed on the de-bonding layer DB carried by the carrier C. In FIG. 5, two chip modules 100 are placed on the de-bonding layer DB. However, the number of the chip modules 100 is merely for illustration, and the disclosure is not limited thereto. In some alternative embodiments, before the chip modules 100 and the second integrated circuit 200 are picked-up and placed on the de-bonding layer DB, a dielectric material (not shown) may be formed on the de-bonding layer DB. In some embodiments, the dielectric material is a polybenzoxazole (PBO) layer or other suitable polymer dielectrics, for example.

As shown in FIG. 5, the chip module 100 and the second integrated circuit 200 are substantially identical in thickness.

In other words, the first conductive terminals 114 and the second conductive terminals 204 are substantially leveled with each other. The second integrated circuit 200 includes a second surface 202 and a plurality of second conductive terminals 204 distributed on the second surface 202. In some embodiments, the first surfaces 112 of the first integrated circuits 110 in the chip modules 100 are substantially coplanar with the second surface 202 of the second integrated circuit 200. Furthermore, the height of the first conductive terminals 114 is substantially equal to the height of the second conductive terminals 204, for example.

The first surfaces 112 of the first integrated circuits 110 is encapsulated by the first dielectric layers 130a, and the second surface 202 of the second integrated circuit 200 is encapsulated by a second dielectric layer 210. The second conductive terminals 204 distributed on the second surface 202 are covered and protected by the second dielectric layer 210. In some embodiments, the first dielectric layers 130a and the second dielectric layer 210 are substantially identical in thickness. The material of the second dielectric layer 210 is a polybenzoxazole (PBO) layer or other suitable polymer dielectrics, for example. Furthermore, the material of the second dielectric layer 210 may be the same as or different from the material of the first dielectric layers 130a. In some alternative embodiments, the formation of the dielectric layers 130 and the second dielectric layer 210 may be omitted in accordance with design requirements. In yet alternative embodiments, the formation of the dielectric layers 130 or the second dielectric layer 210 may be omitted in accordance with design requirements. In other words, merely the first dielectric layers 130 or the second dielectric layer 210 may be formed.

Figure 6:
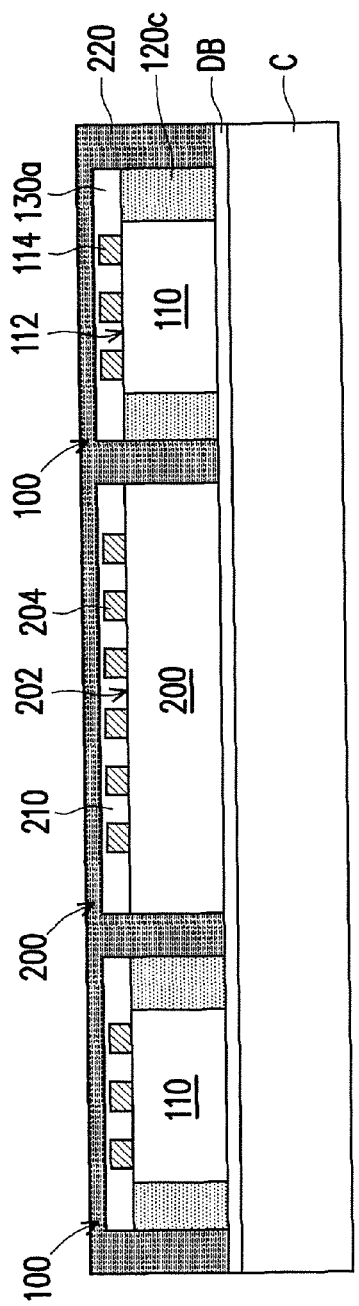

Referring to FIG. 6, an insulating material 220 is formed on the de-bonding layer DB carried by the carrier C so as to encapsulate the chip modules 100 and the second integrated circuit 200. As shown in FIG. 6, the first dielectric layers 130a and the second dielectric layer 210 are encapsulated by the insulating material 220, the first dielectric layers 130a are between the insulating material 220 and the chip modules 100, and the second dielectric layer 210 is between the insulating material 220 and the second integrated circuit 200. In some embodiments, the insulating material 220 is a molding compound formed by a molding process.

Figure 7:
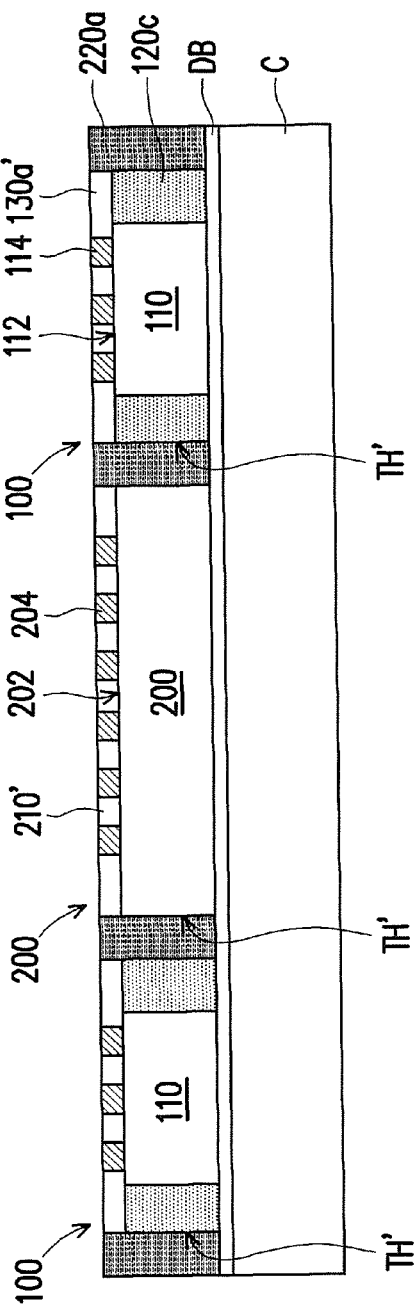

Referring to FIG. 7, the insulating material 220, the first dielectric layers 130a, and the second dielectric layer 210 are grinded until the top surfaces of the first conductive terminals 114 and the top surfaces of the second conductive terminals 204 are exposed. After the insulating material 220, the first dielectric layers 130a, and the second dielectric layer 210 are grinded, the second insulating encapsulation 220a is formed on the carrier C. The first conductive terminals 114 and the second conductive terminals 204 are accessibly exposed from the first insulating encapsulation 120c and the second insulating encapsulation 220a.

After the insulating material 220, the first dielectric layers 130a, and the second dielectric layer 210 are grinded, the first dielectric layers 130a is partially removed to form a first dielectric layers 130a', and the second dielectric layer 210 is partially removed to form a second dielectric layer 210'. As shown in FIG. 7, after the grinding process is performed, the first conductive terminals 114 are laterally encapsulated by the first dielectric layer 130a', and the second conductive terminals 204 are laterally encapsulated by the second dielectric layer 210'. In addition, the thickness of the second insulating encapsulation 220a is greater than the thickness of the first insulating encapsulation 120c.

As shown in FIG. 7, the second insulating encapsulation 220a at least encapsulates the sidewalls of the chip modules 100 and the sidewalls of the second integrated circuit 200. Since the second insulating encapsulation 220a and the first insulating encapsulations 120c of the chip modules 100 are fabricated by different molding processes respectively, interfaces are formed between the second insulating encapsulation 220a and the first insulating encapsulations 120c. The second insulating encapsulation 220a may further encapsulate the sidewalls of the first dielectric layers 130a' and the sidewalls of the second dielectric layers 210'. In addition, the second insulating encapsulation 220a includes a plurality of second through holes TH' for accommodating the chip module 100 and the second integrated circuit 200.

As shown in FIG. 7, it is noted that the top surfaces of the first conductive terminals 114, the top surfaces of the second conductive terminals 204, the exposed surface of the first dielectric layers 130a', and the exposed surface of the second dielectric layers 210' are substantially coplanar.

Figure 8:
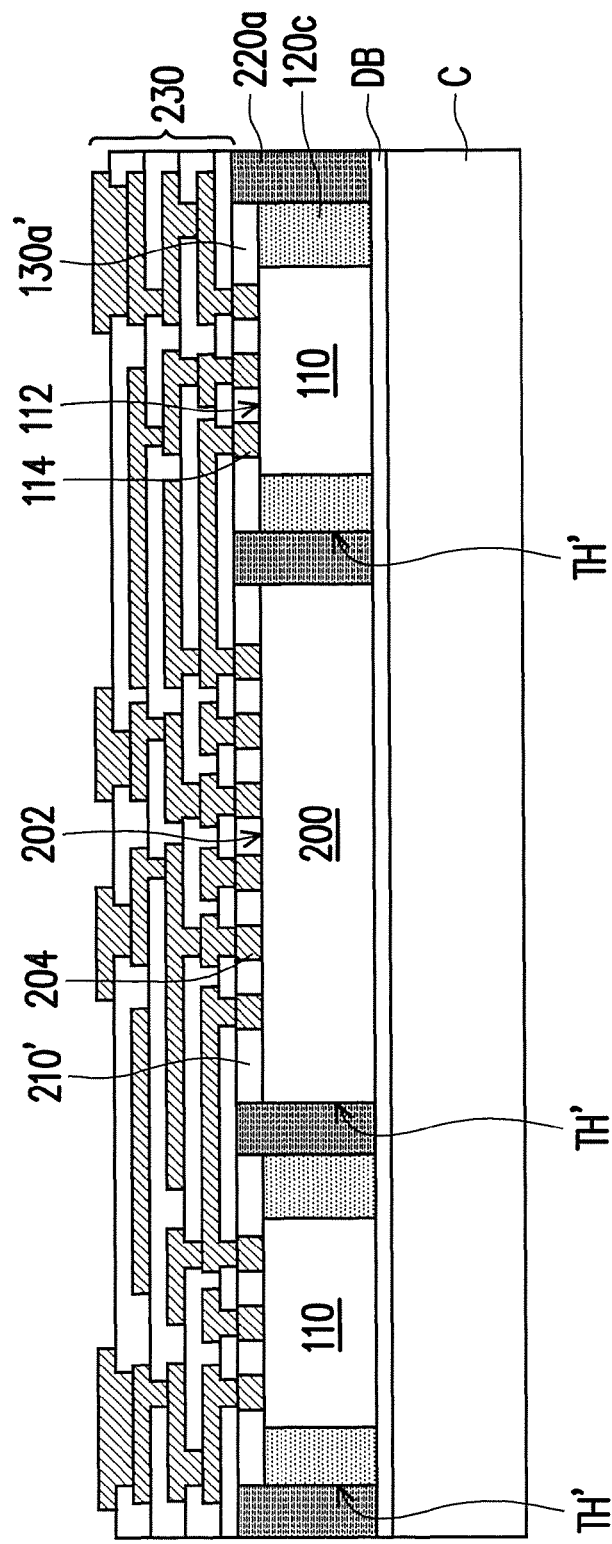

Referring to FIG. 8, after the second insulating encapsulation 220a is formed, a redistribution circuit structure 230 electrically connected to the first conductive terminals 114 of the chip module 100 and the second conductive terminals 204 of the second integrated circuit 200 is formed. The redistribution circuit structure 230 is formed on the exposed surface of the first dielectric layers 130a', the exposed surface of the second dielectric layers 210', and the top surface of the second insulating encapsulation 220a.

As shown in FIG. 8, the first dielectric layer 130a' is between the first surface 112 of the first integrated circuit 110 and the redistribution circuit structure 230, and the second dielectric layer 210' is between the second surface 202 of the second integrated circuit 200 and the redistribution circuit structure 230. In other words, the redistribution circuit structure 230 is formed above the first surface 112 of the first integrated circuits 110, the second surface 202 of the second integrated circuit 200, and the first insulating encapsulation 120c. Furthermore, the redistribution circuit structure 230 is in contact with the second insulating encapsulation 220a.

Figure 9:
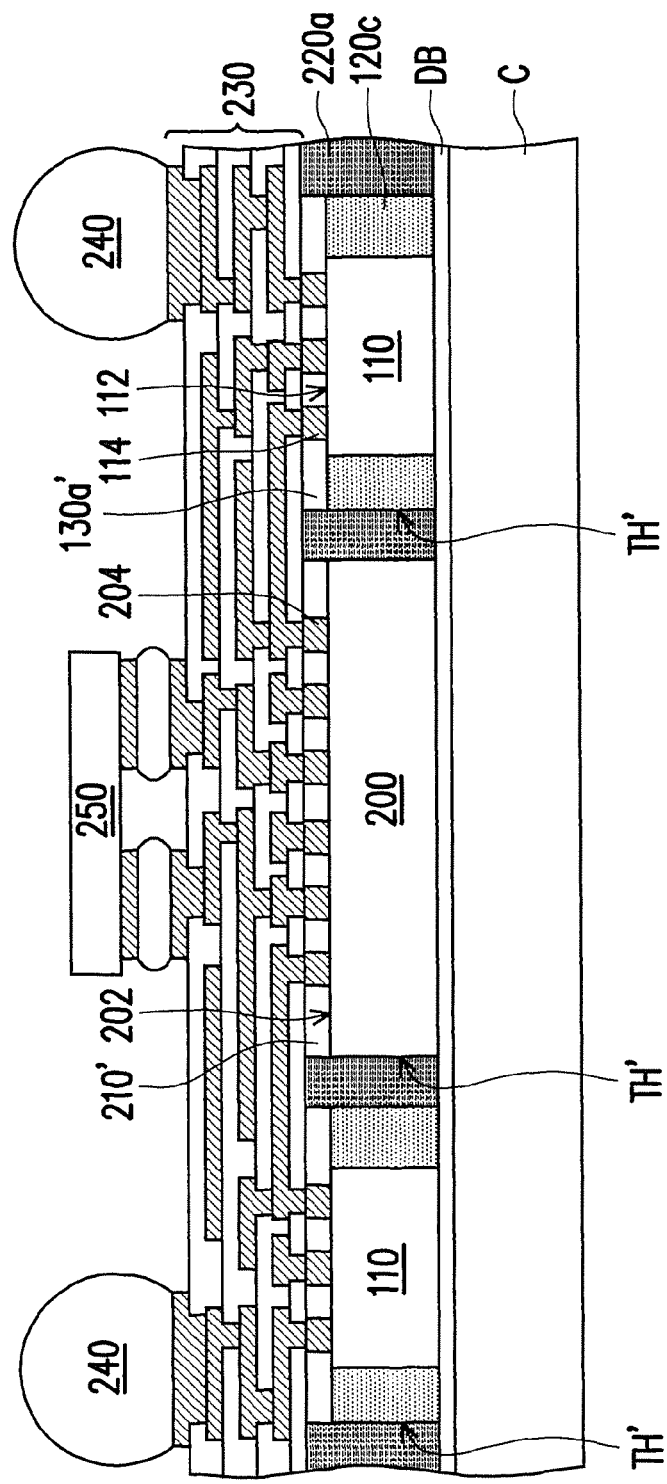

Referring to FIG. 9, after the redistribution circuit structure 230 is formed, a plurality of conductive balls or bumps 240 and/or a plurality of passive components 250 are placed on and are electrically connected to the redistribution circuit structure 230. In some embodiments, the conductive balls or bumps 240 may be placed on the redistribution circuit structure 230 by ball placement process and reflow process, and the passive components 250 may be mounted on the redistribution circuit structure 230 through reflow process. In some alternative embodiments, the conductive balls or bumps 240 may be controlled collapse chip connection (i.e. C4) bumps or copper pillars.

Figure 10:
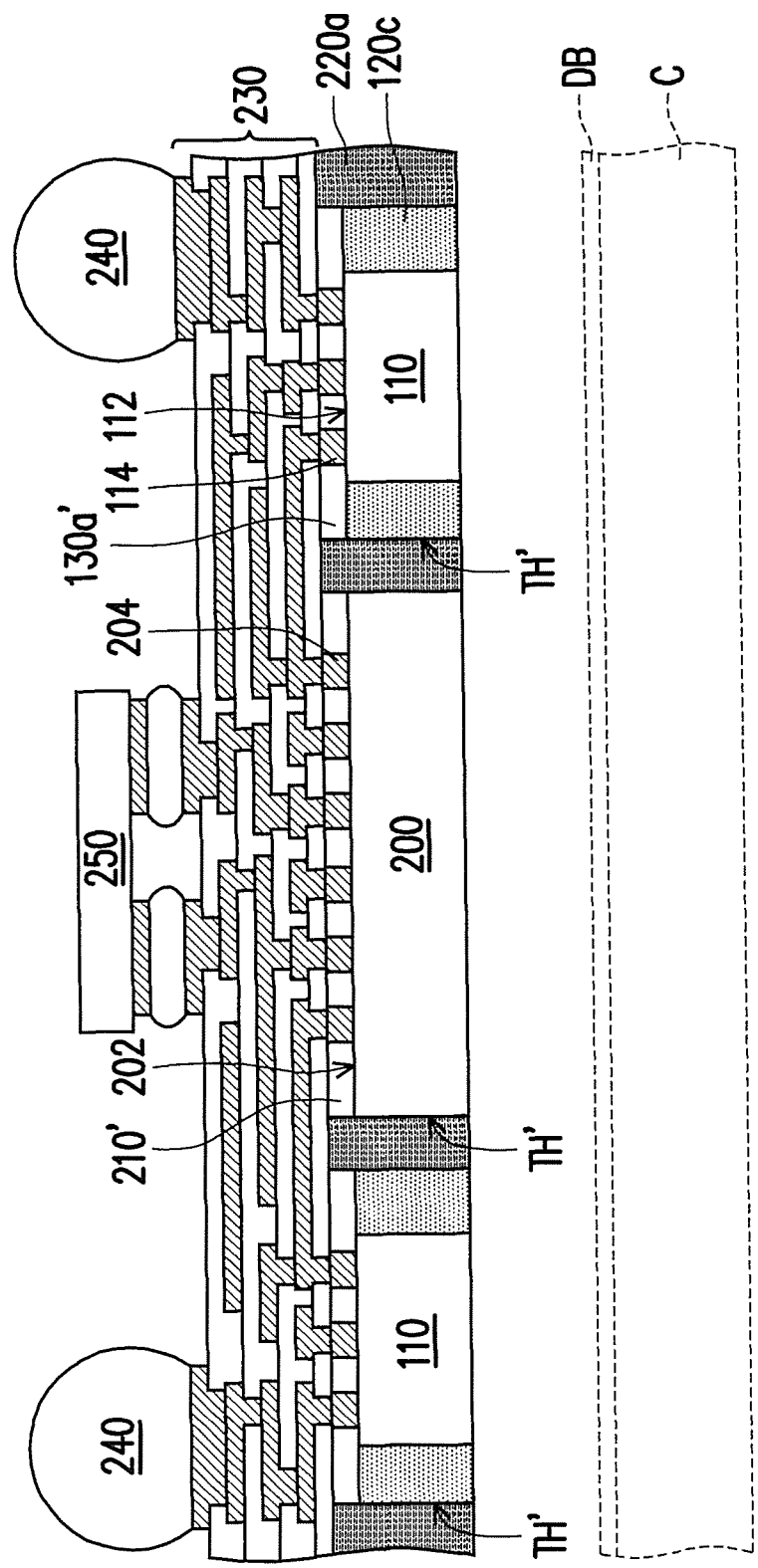

Referring to FIG. 10, after the conductive balls or bumps 240 and/or the passive components 250 are mounted, the de-bonding layer DB is de-bonded from the chip modules 100, the second integrated circuit 200, and the second insulating encapsulation 220a. In some embodiments, the de-bonding layer DB (e.g., the LTHC release layer) may be irradiated by an UV laser such that the de-bonding process is facilitated.

Figure 11:
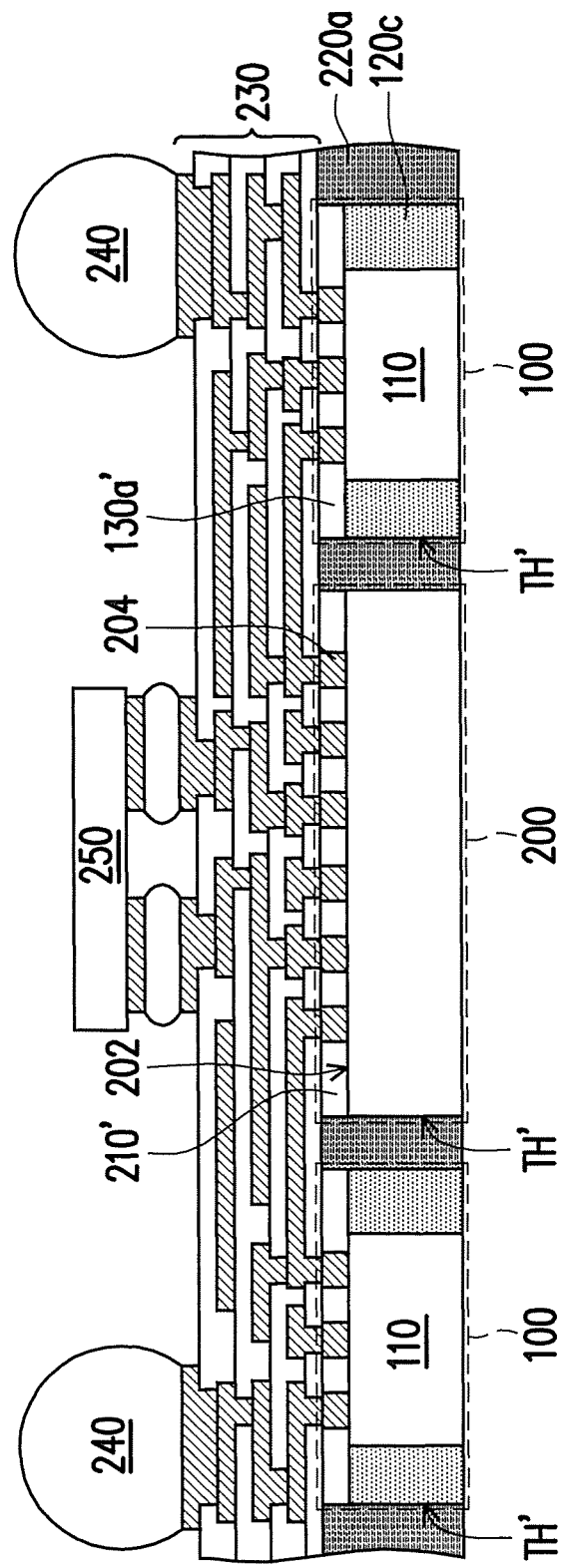
FIGS. 11 through 13 are cross-sectional views illustrating various integrated fan-out packages in accordance with various embodiments.
Figure 12:
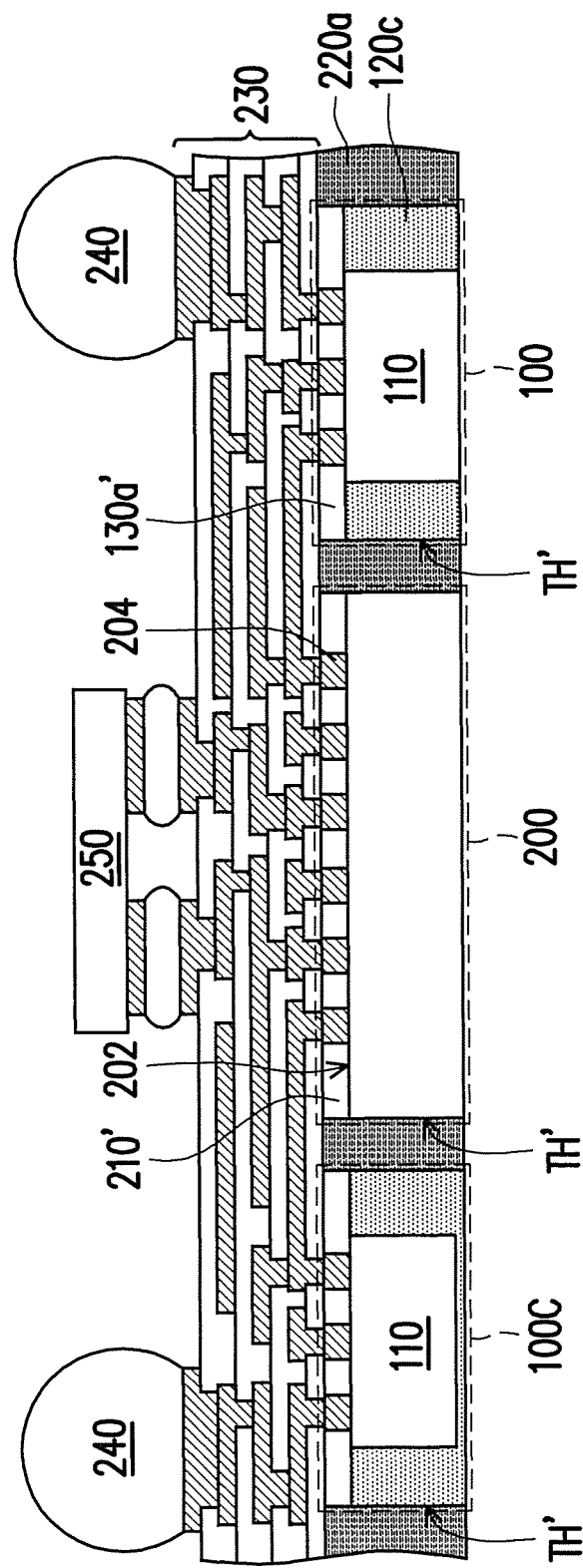
Figure 13:
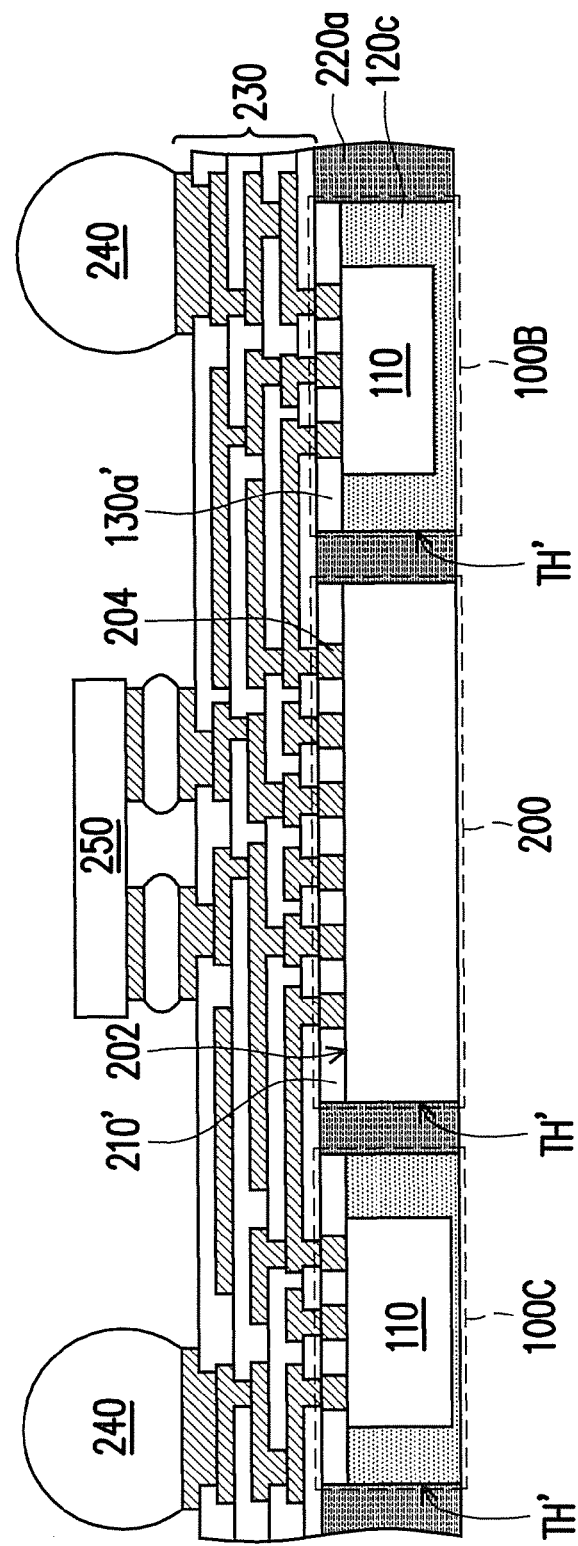

FIGS. 11 through 13 are cross-sectional views illustrating various integrated fan-out packages in accordance with various embodiments. Referring to FIG. 11, the integrated fan-out package includes two chip modules 100, a second integrated circuit 200, a second insulating encapsulation 220a, and a redistribution circuit structure 230. Each of the chip modules 100 includes a first insulating encapsulation 120c and at least one first integrated circuit 110 embedded in the first insulating encapsulation 120c. Each of the first integrated circuits 110 includes a first surface 112 and a plurality of first conductive terminals 114 distributed on the first surface 112. The second integrated circuit 200 includes a second surface 202 and a plurality of second conductive terminals 204 distributed on the second surface 202. The chip module 100 and the second integrated circuit 200 are embedded in the second insulating encapsulation 220a. The first conductive terminals 114 and the second conductive terminals 204 are accessibly exposed from the first insulating encapsulation 120c and the second insulating encapsulation 220a. The redistribution circuit structure 230 covers the first surface 112, the second surface 202, the first insulating encapsulation 112c, and the second insulating encapsulation 220a. The redistribution circuit structure 230 is electrically connected to the first conductive terminals 114 and the second conductive terminals 204.

Referring to FIG. 11 through FIG. 13, the integrated fan-out packages illustrated in FIGS. 12 and 13 are similar with the integrated fan-out package illustrated in FIG. 11. In the integrated fan-out package illustrated in FIG. 12, the chip modules 100 and 100C are used. In the integrated fan-out package illustrated in FIG. 13, the chip modules 100B and 100C are used.

In some alternative embodiments, the integrated fan-out package may merely include one chip module, and the chip module may be the chip module 100, the multi-chip module 100A, the chip module 100B, the chip module 100C, the multi-chip module 100D, and the chip module 100E. In yet alternative embodiments, the integrated fan-out package may include two or more than two chip modules, and the chip modules may be selected from the chip module 100, the multi-chip module 100A, the chip module 100B, the chip module 100C, the multi-chip module 100D, and the chip module 100E.

In the above-mentioned embodiments, the thickness variation or difference of the first integrated circuits 110 can be minimized through the thickness leveling process. Accordingly, the above-mentioned integrated fan-out packages have good reliability and yield rate.

In accordance with some embodiments of the present disclosure, an integrated fan-out package including a chip module, a second integrated circuit, a second insulating encapsulation, and a redistribution circuit structure is provided. The chip module includes a first insulating encapsulation and at least one first integrated circuit embedded in the first insulating encapsulation. The first integrated circuit includes a first surface and a plurality of first conductive terminals distributed on the first surface. The second integrated circuit includes a second surface and a plurality of second conductive terminals distributed on the second surface. The chip module and the second integrated circuit are embedded in the second insulating encapsulation. The first conductive terminals and the second conductive terminals are accessibly exposed from the first insulating encapsulation and the second insulating encapsulation. The redistribution circuit structure covers the first surface, the second surface, the first insulating encapsulation, and the second insulating encapsulation. The redistribution circuit structure is electrically connected to the first conductive terminals and the second conductive terminals.

In accordance with alternative embodiments of the present disclosure, a method of fabricating an integrated fan-out package is provided. The method includes the following steps. At least one chip module including a first insulating encapsulation and at least one first integrated circuit embedded in the first insulating encapsulation is provided, wherein the at least one first integrated circuit includes a first surface and a plurality of first conductive terminals distributed on the first surface. A second integrated circuit including a second surface and a plurality of second conductive terminals distributed on the second surface is provided. The at least one chip module and the second integrated circuit are placed on a carrier with the first conductive terminals and the second conductive terminals substantially leveled with each other. A second insulating encapsulation is formed on the carrier to encapsulate sidewalls of the at least one chip module and sidewalls of the second integrated circuit. A redistribution circuit structure is formed on the at least one chip module, the second insulating encapsulation, and the second integrated circuit. The redistribution circuit structure is electrically connected to the first conductive terminals and the second conductive terminals.

In accordance with yet alternative embodiments of the present disclosure, another method of fabricating an integrated fan-out package is provided. The method includes the following steps. A plurality of first integrated circuits are mounted on a substrate through an adhesive. Each of the first integrated circuits includes a first surface facing the substrate and a plurality of first conductive terminals distributed on the first surface. The first integrated circuits are encapsulated with a molding compound to form a pre-molded structure. The pre-molded structure is de-bonded from the adhesive. The pre-molded structure is singulated to form a plurality of chip modules, and each of the chip modules includes at least one of the first integrated circuits. At least one of the chip modules is provided on a carrier having a de-bonding layer disposed thereon. The at least one chip module includes a first insulating encapsulation and at least one first integrated circuit embedded in the first insulating encapsulation. The second integrated circuit includes a second surface and a plurality of second conductive terminals distributed on the second surface, and the first conductive terminals and the second conductive terminals are substantially leveled with each other. A second insulating encapsulation is formed on the de-bonding layer to encapsulate sidewalls of the at least one chip module and sidewalls of the second integrated circuit. A redistribution circuit structure is formed on the at least one chip module, the second insulating encapsulation, and the second integrated circuit. The redistribution circuit structure is electrically connected to the first conductive terminals and the second conductive terminals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated fan-out package, the method comprising:
   providing at least one chip module comprising a first insulating encapsulation and at least one first integrated circuit embedded in the first insulating encapsulation, the at least one first integrated circuit comprising a first active surface, a first rear surface opposite to the first active surface, and a plurality of first conductive terminals distributed on the first active surface;

providing a second integrated circuit, the second integrated circuit comprising a second active surface, a second rear surface opposite to the second active surface, and a plurality of second conductive terminals distributed on the second active surface;

placing the at least one chip module and the second integrated circuit on a carrier with the first conductive terminals and the second conductive terminals substantially leveled with each other, wherein the first rear surface and the second rear surface face the carrier;

forming a second insulating encapsulation on the carrier to encapsulate sidewalls of the at least one chip module and sidewalls of the second integrated circuit; and forming a redistribution circuit structure on the at least one chip module, the second insulating encapsulation, and the second integrated circuit, wherein the redistribution circuit structure is electrically connected to the first conductive terminals and the second conductive terminals.

2. The method of claim 1, wherein providing the chip module comprises:

mounting a plurality of first integrated circuits on a substrate through an adhesive between the first integrated circuits and the substrate, and each of the first integrated circuits comprising the first active surface and the first conductive terminals;

encapsulating the first integrated circuits by a molding compound to form a pre-molded structure, and the pre-molded structure comprising the molding compound and the first integrated circuits embedded in the molding compound;

de-bonding the pre-molded structure from the adhesive; and singulating the pre-molded structure to form a plurality of chip modules, wherein each of the chip modules comprises at least one of the first integrated circuits.

3. The method of claim 1, wherein providing the chip module comprises:

mounting a plurality of first integrated circuits on a substrate through an adhesive between the first integrated circuits and the substrate, and each of the first integrated circuits comprising the first active surface and the first conductive terminals;

encapsulating the first integrated circuits by a molding compound to form a pre-molded structure, and the pre-molded structure comprising the molding compound and the first integrated circuits embedded in the molding compound;

grinding the molding compound until a thickness of the pre-molded structure is substantially equal to a thickness of the second integrated circuit;

de-bonding the pre-molded structure from the adhesive; and singulating the pre-molded structure to form a plurality of chip modules, wherein each of the chip modules comprises at least one of the first integrated circuits.

4. The method of claim 3, wherein the first integrated circuits are encapsulated by the molding compound and at least parts of the first integrated circuits are exposed after grinding the molding compound.

5. The method of claim 3, wherein the at least one chip module and the second integrated circuit one the carrier are identical in thickness.

6. A method of fabricating an integrated fan-out package, the method comprising:

mounting a plurality of first integrated circuits on a substrate through an adhesive, each of the first integrated circuits comprising a first active surface facing the substrate, a first rear surface opposite to the first active surface and a plurality of first conductive terminals distributed on the first active surface;

encapsulating the first integrated circuits with a molding compound to form a pre-molded structure;

de-bonding the pre-molded structure from the adhesive;

singulating the pre-molded structure to form a plurality of chip modules, each of the chip modules comprising at least one of the first integrated circuits;

providing at least one of the chip modules and a second integrated circuit on a carrier having a de-bonding layer disposed thereon, the at least one chip module comprising a first insulating encapsulation and at least one first integrated circuit embedded in the first insulating encapsulation, the second integrated circuit comprising a second active surface, a second rear surface opposite to the second active surface and a plurality of second conductive terminals distributed on the second active surface, the first conductive terminals and the second conductive terminals being substantially leveled with each other, and the first rear surface and the second rear surface face the carrier;

forming a second insulating encapsulation on the de-bonding layer to encapsulate sidewalls of the at least one chip module and sidewalls of the second integrated circuit; and forming a redistribution circuit structure on the at least one chip module, the second insulating encapsulation, and the second integrated circuit, wherein the redistribution circuit structure is electrically connected to the first conductive terminals and the second conductive terminals.

7. The method of claim 6, wherein the pre-molded structure comprises the molding compound and the first integrated circuits embedded in the molding compound.

8. The method of claim 7 further comprising:

grinding the molding compound until a thickness of the pre-molded structure is substantially equal to a thickness of the second integrated circuit.

9. The method of claim 8, wherein the first integrated circuits are encapsulated by the molding compound and at least parts of the first integrated circuits are exposed after grinding the molding compound.

10. The method of claim 8, wherein the at least one chip module and the second integrated circuit on the carrier are identical in thickness.

11. The method of claim 6 further comprising:

de-bonding the de-bonding layer from the at least one chip module, the second integrated circuit, and the second insulating encapsulation.

* * * * *